(12) United States Patent
Lehner et al.

(10) Patent No.: US 7,472,364 B2
(45) Date of Patent: Dec. 30, 2008

(54) METHOD OF MATCHING LAYOUT SHAPES PATTERNS IN AN INTEGRATED CIRCUIT USING WALSH PATTERNS

(75) Inventors: Valerie D. Lehner, Hopewell Junction, NY (US); Timothy S. Lehner, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 11/461,857

(22) Filed: Aug. 2, 2006

(65) Prior Publication Data

US 2008/0034339 A1 Feb. 7, 2008

(51) Int. Cl.
G06F 17/50 (2006.01)
(52) U.S. Cl. .............................................. 716/5; 716/4
(58) Field of Classification Search .................. 716/4–6
See application file for complete search history.

(56) References Cited

U.S. PATENT DOCUMENTS

| | | | |
|---|---|---|---|
| 6,189,130 B1 * | 2/2001 | Gofman et al. ................ | 716/7 |
| 7,284,230 B2 * | 10/2007 | Bergman Reuter et al. .... | 716/21 |
| 7,353,472 B2 * | 4/2008 | DeMaris et al. ................ | 716/4 |
| 2005/0094863 A1 | 5/2005 | Bergman Reuter et al. | |
| 2006/0023932 A1 | 2/2006 | DeMaris et al. | |

OTHER PUBLICATIONS

Hesselroth et al. "The Dynamics of Image Processing by Feature Maps in the Primary Visual Cortex", Department of Physics and Beckman Institute, University of Illinois, Apr. 29, 2005, pp. 1-39.*

Eric W. Weisstein. "Walsh Function", as described in MathWorld—A Wolfram Web Resource, (http://mathworld.wolfram.com/WalshFunction.html,).

Eric W. Weisstein, "Orthogonal Basis", extracted from MathWorld—A Wolfram Web Resource, (http://mathworld.wolfram.com/OrthogonalBasis.html.).

Eric W. Weisstein et al. in "Vector Space Basis", MathWorld—A Wolfram Web Resource, (http://mathworld.wolfram.com/VectorSpaceBasis.html).

Ted Hesselroth and Klaus Schulten, "The Dynamics of Image Processing by Feature Maps in the Primary Visual Cortex", Department of Physics and Beckman Institute, University of Illinois, Urbana, Illinois 61801, Apr. 29, 2005.

* cited by examiner

*Primary Examiner*—Jack Chiang
*Assistant Examiner*—Binh C Tat
(74) *Attorney, Agent, or Firm*—Cantor Colburn LLP; H. Daniel Schnurmann (57) ABSTRACT

A method for matching patterns, based on an orthogonal sub-space projection of layout shapes using Walsh patterns, performs a preliminary density feature extraction of a circuit design layout, allows a user to define a pattern, and performs a high resolution search of the layout to locate all instances of the pattern. A sorted list of layout windows ranging from the most similar to quantitatively less similar is generated. The method for matching patterns significantly reduces false positives in comparison with the prior art and enables the same density data to be reused as a window is stepped in small increments across the layout.

9 Claims, 6 Drawing Sheets

METHOD OF MATCHING LAYOUT SHAPES PATTERNS IN AN INTEGRATED CIRCUIT USING WALSH PATTERNS

FIELD OF THE INVENTION

The present invention generally relates to the field of Design Automation, and more particularly, to a method for matching layout shapes patterns in a larger integrated circuit shapes layout for the purpose of performing a systematic defect analysis.

DESCRIPTION OF RELATED ART

Systematic defects in a semiconductor process are defects which are not a result of particles interfering with exposure or other lithographic process steps during manufacturing. Instead, systematic defects relate to shapes layout design flaws or processing design flaws and which occur regularly at the same location within a finished product. Yield characterization engineers face a difficult task when trying to identify the root cause of such defects. Particularly, in modern processes requiring resolution enhancement, chemo-mechanical polishing and other complex steps, the root cause often involves the interaction of a particular local pattern with the shapes within its context.

A pattern is defined as a rectangular area containing specific layout shapes. The same pattern which results in a deterministic fail or is not robust to process variations in a particular part number may not fail in other locations on the same design, or on a different design. The problem faced by the engineers encountering a systematic failure can be formulated as a search task. The engineer defines a small portion of the layout as the pattern, and attempts to find locations in the design which are similar to that pattern.

A layout shapes pattern matching system provides a methodology for locating shapes that are similar to those which induce pattern-dependent systematic defects in integrated circuits. A window is defined as a rectangular portion of the integrated circuit shapes layout. Pattern matching systems generally return either a binary result or a distance measurement. Pattern matching systems which return a binary result classify locations in the layout as either matching or not matching the given pattern. Pattern matching systems that return a distance measurement sort layout windows according to their similarity to the given pattern, so that windows are ordered from most similar to least similar. The present invention focuses on the latter type, returning a sorted list of windows.

Feature extraction is a technique in which salient features of both a target pattern and a potential match are extracted and compared. Feature extraction is used in many image recognition applications. In the preferred embodiment of the invention, the feature to be extracted is the density. Density is defined as the fraction of layout shapes coverage in a window. For example, a window which is half-covered by layout shapes has a density of 0.5. Practitioners of the art will readily appreciate that density extraction is a common application in layout shapes analysis, and many software tools exist for extracting the density from the windows in the layout.

After extracting the density features from both the layout pattern and the layout windows, an image recognition system necessitates an approach for comparing the pattern under consideration with a particular layout window. In order to achieve this goal, the features are projected onto a coordinate system, also referred to as the feature space. One can compare the distance between two objects in the usual two-dimensional space using Euclidean distance. The Euclidean distance between objects 1 and 2 is the given by:

$$\sqrt{(X1-X2)^2+(Y1-Y2)^2}$$

In the same manner, one calculates the distance between two layouts by projecting the features onto an n-dimensional space and calculating the Euclidean distance between them.

Figure 1:
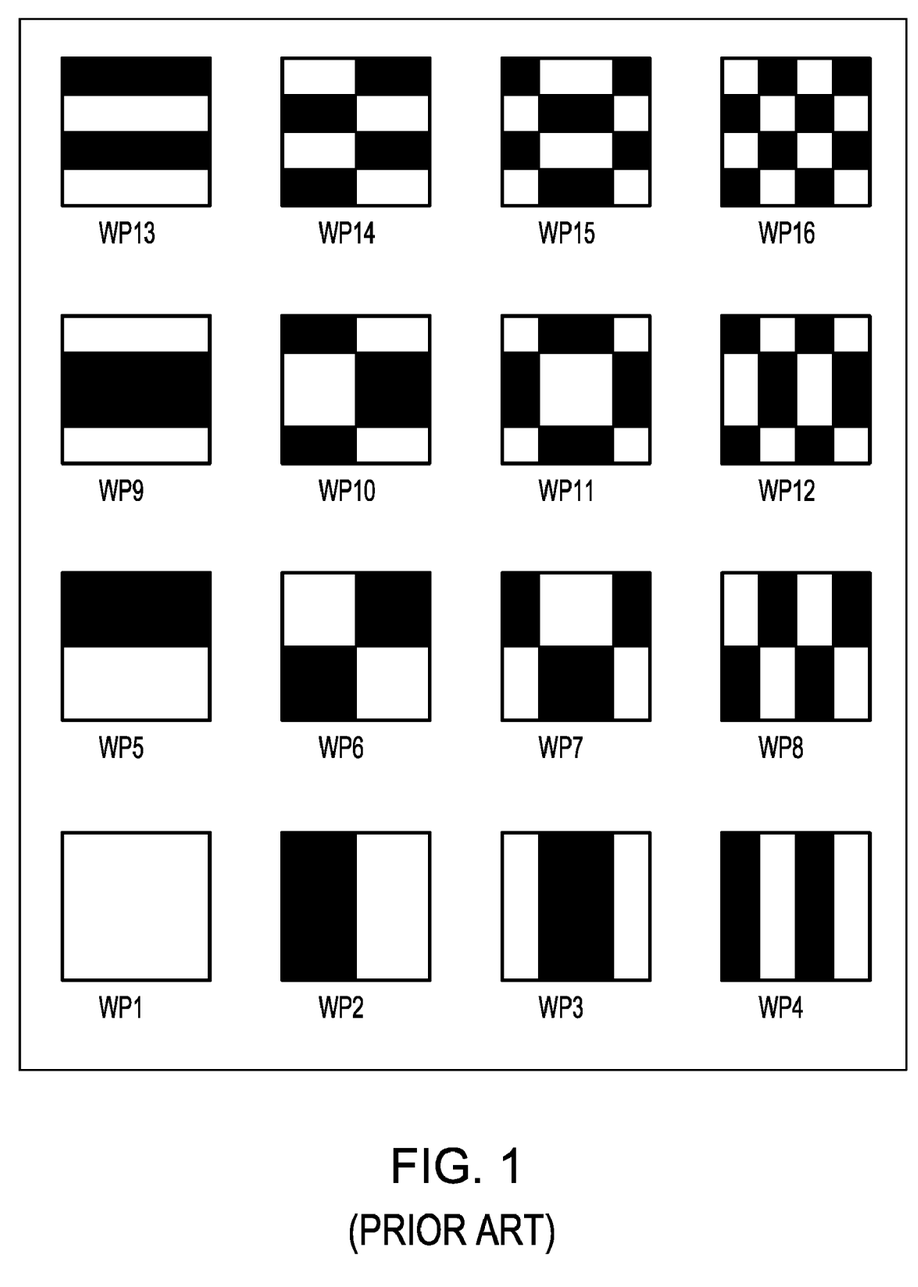
FIG. 1 is a schematic diagram of an example of prior art Walsh patterns.

One feature space which has been used is based upon Walsh patterns, as illustrated in FIG. 1, in which typical Walsh patterns are depicted. As will be readily understood by one ordinarily skilled in the art, the choice of 16 is merely an illustration, and any orthogonal set of Walsh patterns may be used.

Walsh patterns are images consisting of a plurality of rectangular tilings of black and white areas. Walsh patterns are generated from Walsh Functions, and can be derived from a 4×4 Hadamard matrix by rotations and multiplications (Eric W. Weisstein. "Walsh Function" as described in "*Math-World*—A Wolfram Web Resource" (http://mathworld.wolfram.com/WalshFunction.html, herein incorporated by reference).

The Walsh functions consist of trains of square pulses (with the allowed states being −1 and 1) such that transitions may only occur at fixed intervals of a unit time step, the initial state is always +1, and the functions satisfy certain other orthogonality relations. In particular, the $2^n$ Walsh functions of order 'n' are given by the rows of the Hadamard matrix $H_2^n$ when arranged in a so-called "sequency" order. There are $2^n$ Walsh functions of length $2^n$.

Originally, Walsh Patterns were used as a set of basis elements for image representation, as described in the publication "The Dynamics of Image Processing by Feature Maps in the Primary Visual Cortex", by Ted Hesselroth and Klaus Schulten, Department of Physics and Beckman Institute, University of Illinois, Urbana, Ill. 61801, Apr. 29, 2005.

Walsh patterns are also used for generating a set of layout test patterns, as described in U.S. Patent Application Publication No. 2006/0023932 "System and method for generating a set of test patterns for an optical proximity correction algorithm" to De Maris, et al.

Walsh patterns have been used for numerically describing density features of layout. In the prior art, the Walsh patterns are represented as shapes which are intersected with each layout window. The density of the intersected shapes is extracted and treated as a projection. More details may be found in the U.S. Patent Application Publication 2005/0094863 A1, "System for search and analysis of systematic defects in integrated circuits" to Bergman Reuter et al., which is hereby incorporated by reference. In the prior art, shapes within a layout window are intersected with each Walsh pattern in a set of Walsh patterns, in which the "off" sub-windows of the Walsh patterns are treated as 0's and the "on" sub-windows thereof are treated as 1's in any intersection operation. However, the prior art intersection method is not an orthogonal projection. Treating "off" sub-windows of the Walsh patterns as 0's results in non-perpendicular basis vectors in the Walsh pattern feature space. The non-orthogonality of the former projection system can be verified by projecting each Walsh pattern onto the others, as described by Eric W. Weisstein in "Orthogonal Basis" extracted from *Math-World*—A Wolfram Web Resource, http://mathworld.wolfram.com/OrthogonalBasis.html. The problem with the non-orthogonal projection system is that data loss occurs. Rather than having 16 independent axes in the coordinate system, some of the axes can be described as a linear combination of other axes (Eric W. Weisstein et al. in "Vector Space Basis", MathWorld—A Wolfram Web Resource, http://mathworld. wolfram.com/VectorSpaceBasis.html). Therefore, a 16-element feature vector derived from a non-orthogonal projection has less than 16 independent features. The feature resolution is poor, resulting in excessive false positives. In contrast, the correct Walsh patterns constructed from the Walsh Function have a value of −1 for the "off" sub-windows. The feature extraction and projection methods in the present invention result from the understanding that the orthogonality of a basis set is determined solely by the orthogonality of the projection method. The present invention correctly constructs a feature space based on the Walsh patterns.

In addition to excessive false positives, the prior art intersection method precludes reusing density values. Density values are calculated from the layout after the integrated circuit shapes layout has been intersected with a Walsh pattern layout. Any layout window overlapping would have required a complete recalculation of all the density and the intersection data. Therefore, there is no way by which one may achieve a higher resolution search using the prior art method of image recognition. Inability to achieve a higher resolution search results in missed matches. In contrast, the present invention extracts the density from the layout as a preprocessing step, allowing the density values to be reused.

OBJECTS AND SUMMARY OF THE INVENTION

Accordingly, it is an object of the invention to reduce false positives in pattern matching by using an orthogonal sub-space projection of layout shapes using Walsh patterns.

It is another object of the invention to separate the density extraction from the projection, allowing overlapping windows for high resolution search and allowing density data to be reused for other target window sizes.

It is yet another object of the invention to provide a pattern matching system which performs a preliminary feature extraction of the circuit design, allows the user to define the pattern, and performs feature-based searching of the layout to locate all instances of that pattern, by way of an orthogonal sub-space projection of layout shapes using Walsh patterns. A sorted list of layout windows ranging from the most similar to quantitatively less similar is generated. Once these regions of interest have been identified, engineers performs an analysis to determine what is different about the similar but non-failing shapes, or what is common among the failing shapes. Engineers can then take corrective action, either in the form of process adjustments or updated design rules.

These and other objects of the invention are provided by a pattern matching system for layout shapes using Walsh patterns. The invention reduces false positives in pattern matching in comparison to the prior art method. The invention enables the same density data to be reused as a window is stepped in small increments across the layout, whereas the prior art method prevented density data from being reused. The invention also enables the same density data to be reused for other target window sizes. Any subset of Walsh patterns is covered and the invention is not limited to having the Walsh pattern resolution be the same as the layout window resolution.

In summary, the preferred embodiment of the invention establishes a window grid for the circuit design and performs a preliminary extraction of the density (fraction of layout shapes coverage) from each window. After performing the density extraction, the preferred embodiment of the invention composes overlapping windows of the same size as the target pattern's window for high resolution search. Shapes are transformed into feature vectors by performing an orthogonal projection of the shape densities onto Walsh patterns, which form basis vectors in the feature space. A search is then performed, calculating the Euclidean distance from the target pattern to each of the layout windows.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

DETAILED DESCRIPTION OF THE INVENTION

The present invention and the various features and advantageous details thereof are explained more fully with reference to the non-limiting embodiments that are illustrated in the accompanying drawings and detailed in the following description.

Referring to FIG. 1, a set of typical Walsh patterns is selected. As would be readily understood by one ordinarily skilled in the art, the choice of 16 is merely an example and any orthogonal set of Walsh patterns may be used.

Figure 2:
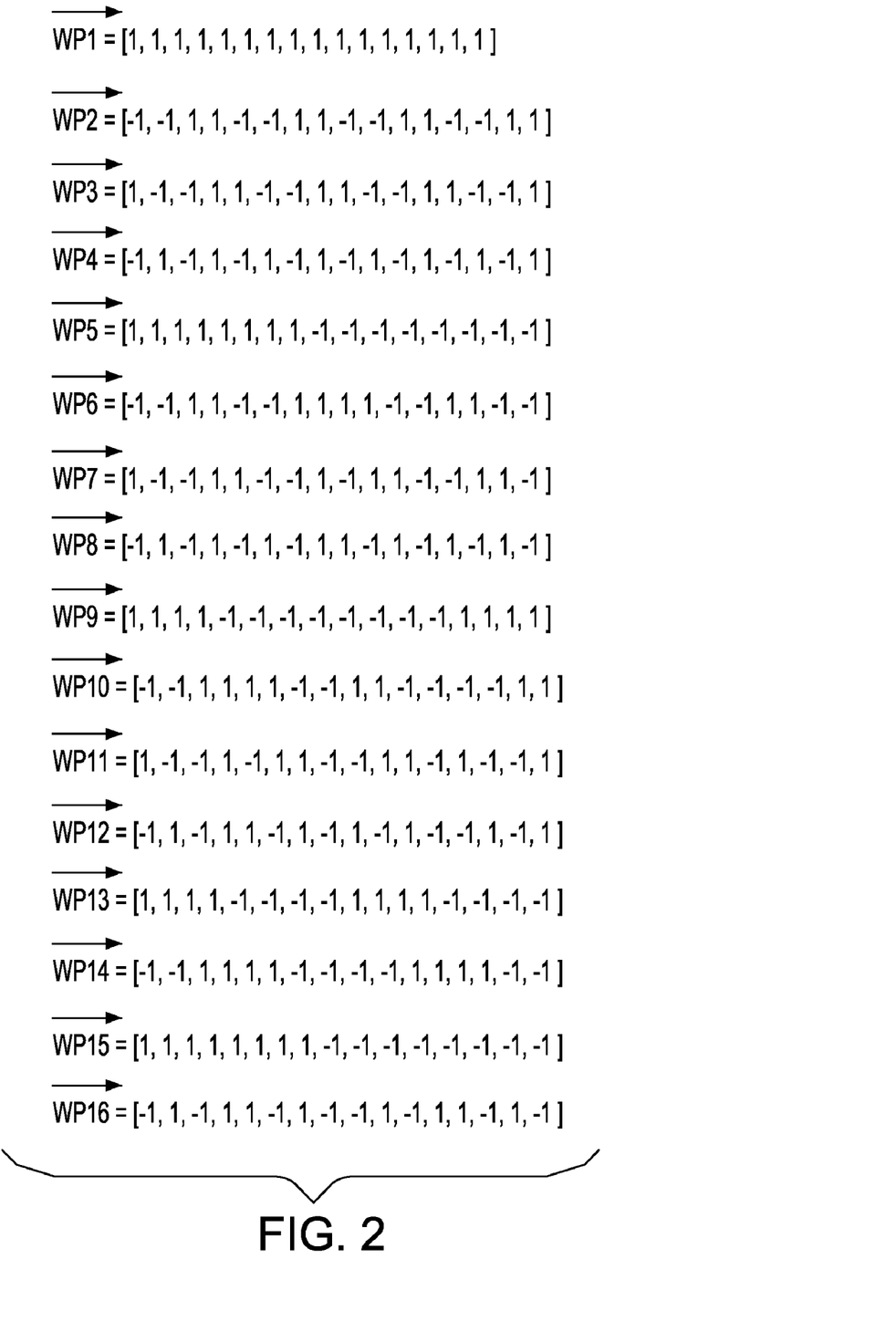
FIG. 2 is a schematic diagram of a basis vector representation of the Walsh patterns.

Referring to FIG. 2, the Walsh patterns define basis vectors which form the feature space. In the example illustrated, the feature space is 16-dimensional. The conversion process from a Walsh pattern to the corresponding basis vectors shown in FIG. 2 is as follows. Each Walsh pattern is divided into 16 rectangles (4 rows and 4 columns). Beginning with the bottom row and the lower left corner of the image and progressing from left to right for each row, a +1 is used for each black rectangle and −1 for each white rectangle. Since each Walsh pattern is comprised of 16 rectangles, there are 16 entries in the corresponding basis vector.

The basis vectors listed in FIG. 2 form the axes of the coordinate system of the Walsh pattern feature space. The basis vectors are used to generate a numerical representation of the shapes within any given layout window. As will be described hereinafter, the present invention includes an orthogonal sub-space projection method for projecting layout shapes onto the W-dimensional coordinate system defined by W Walsh pattern basis vectors. In the case selected, W=16, although the invention includes any orthogonal set of Walsh patterns.

Figure 3:
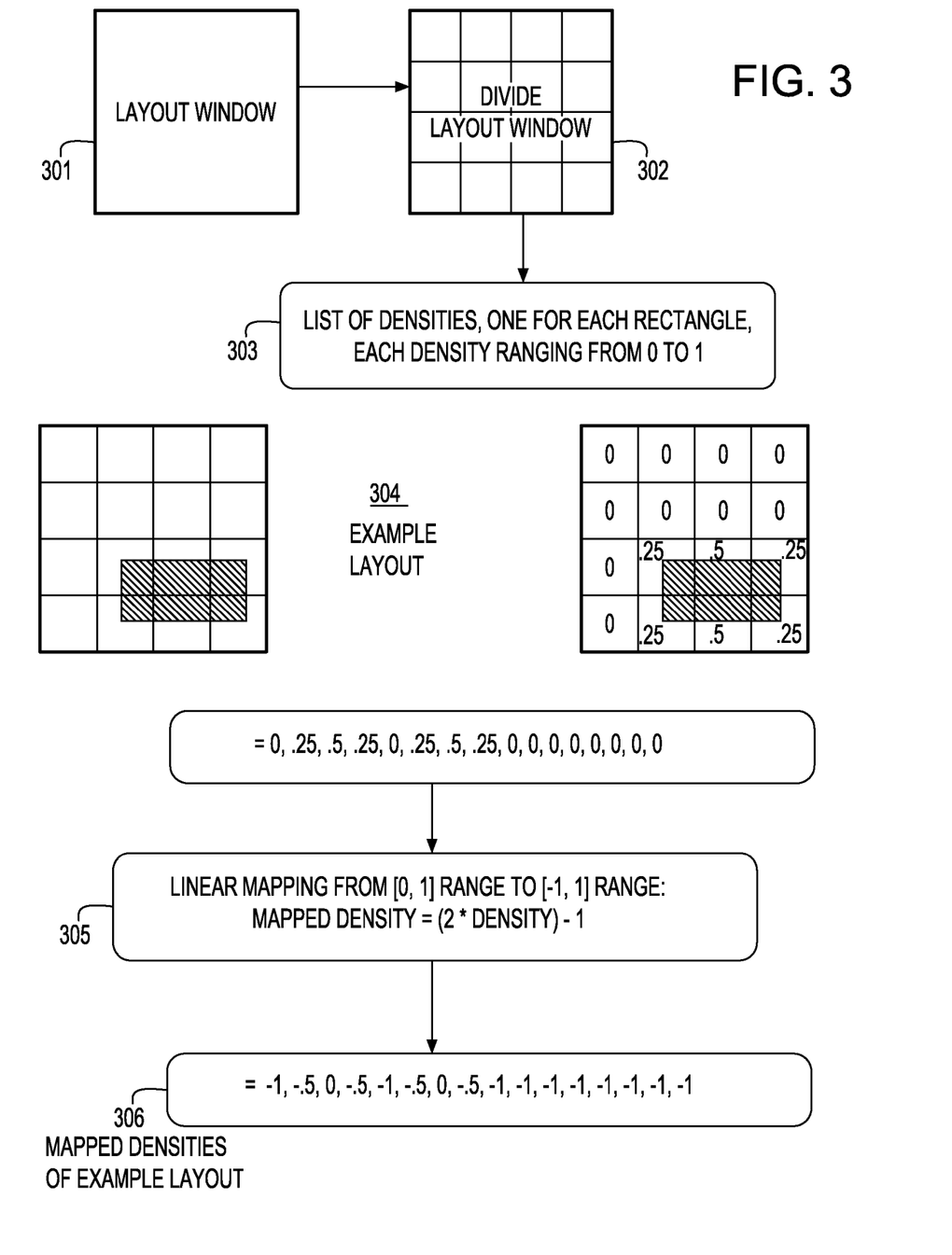
FIG. 3 is a flowchart illustrating density extraction according to a preferred embodiment of the present invention.

Referring to FIG. 3, there is shown a flowchart that illustrates of the density extraction of the present invention. In the preferred embodiment, the feature which is extracted is the density (fractional area of the window covered by shapes), however the present invention includes any feature which can be extracted from an integrated circuit shapes layout.

The density is extracted from any layout window (Step 301) by dividing the layout window (Step 302) into equal-sized rectangles and extracting the density from each rectangle. The result is a list of densities, one for each rectangle, where each density ranges from 0 to 1 (Step 303). The example (Step 304) shows a layout window with one shape therein. The shape covers a portion of 6 out of the 16 rectangles. Density extraction results in a list of 16 values, one corresponding to the density in each rectangle of the layout window. The density values are then mapped to the range −1 to 1 (Step 305), as shown in the example (Step 306).

The density of the layout shapes is the feature which is projected onto the basis vectors. The actual orthogonal sub-space projection method is fully described following the details of the pattern matching system.

Figure 4:
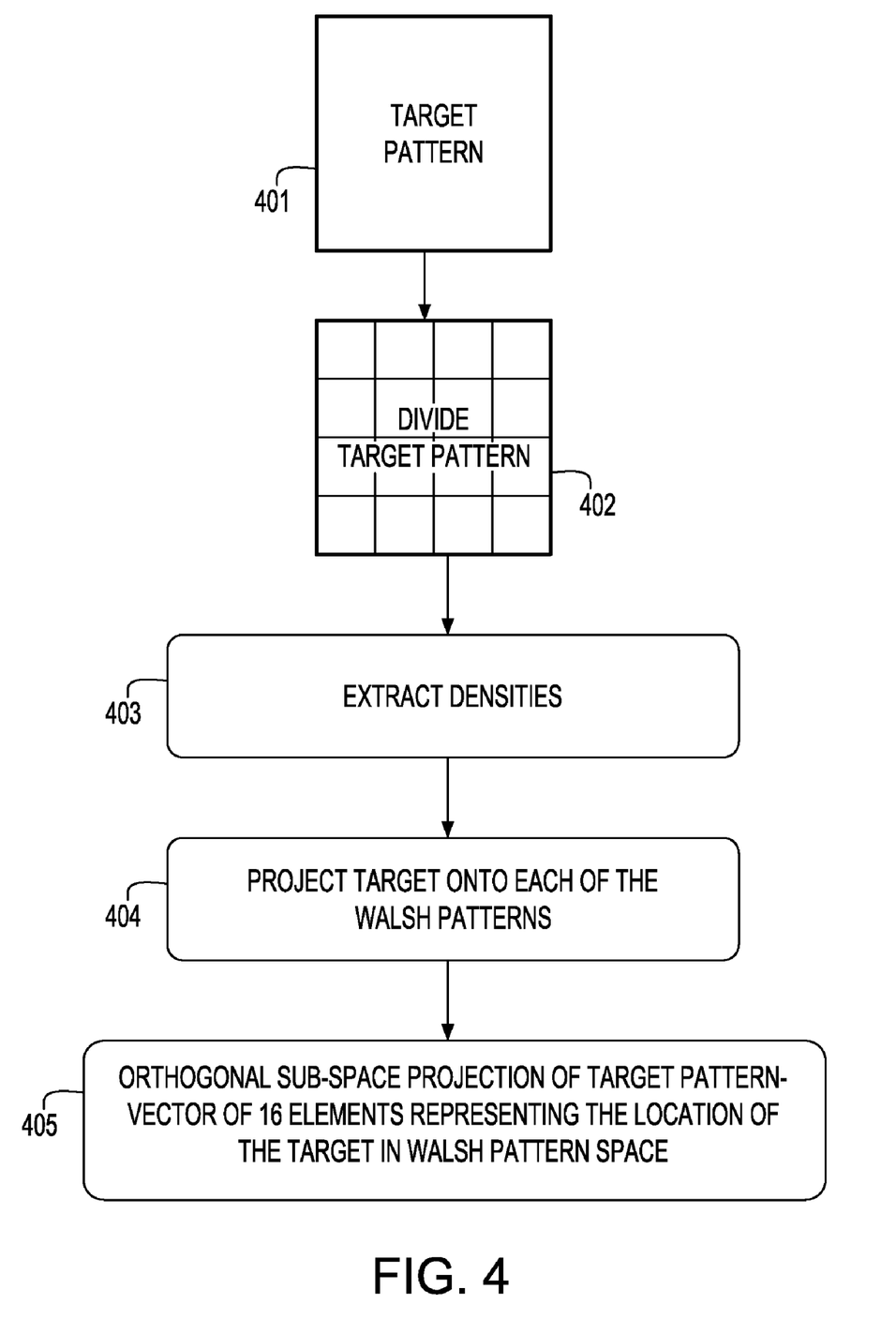
FIG. 4 is a flowchart illustrating projection of the target pattern onto the Walsh pattern space.

Referring to FIG. 4, the user defines a target pattern containing the shapes which induce pattern-dependent systematic defects (Step 401). The pattern is divided into 16 equal-sized rectangles (Step 402). The densities are extracted as described in FIG. 3 (Step 403). The densities are projected onto each of the Walsh patterns (Step 404). The result is a vector of 16 elements representing the location of the target in Walsh pattern space (Step 405).

Figure 5:
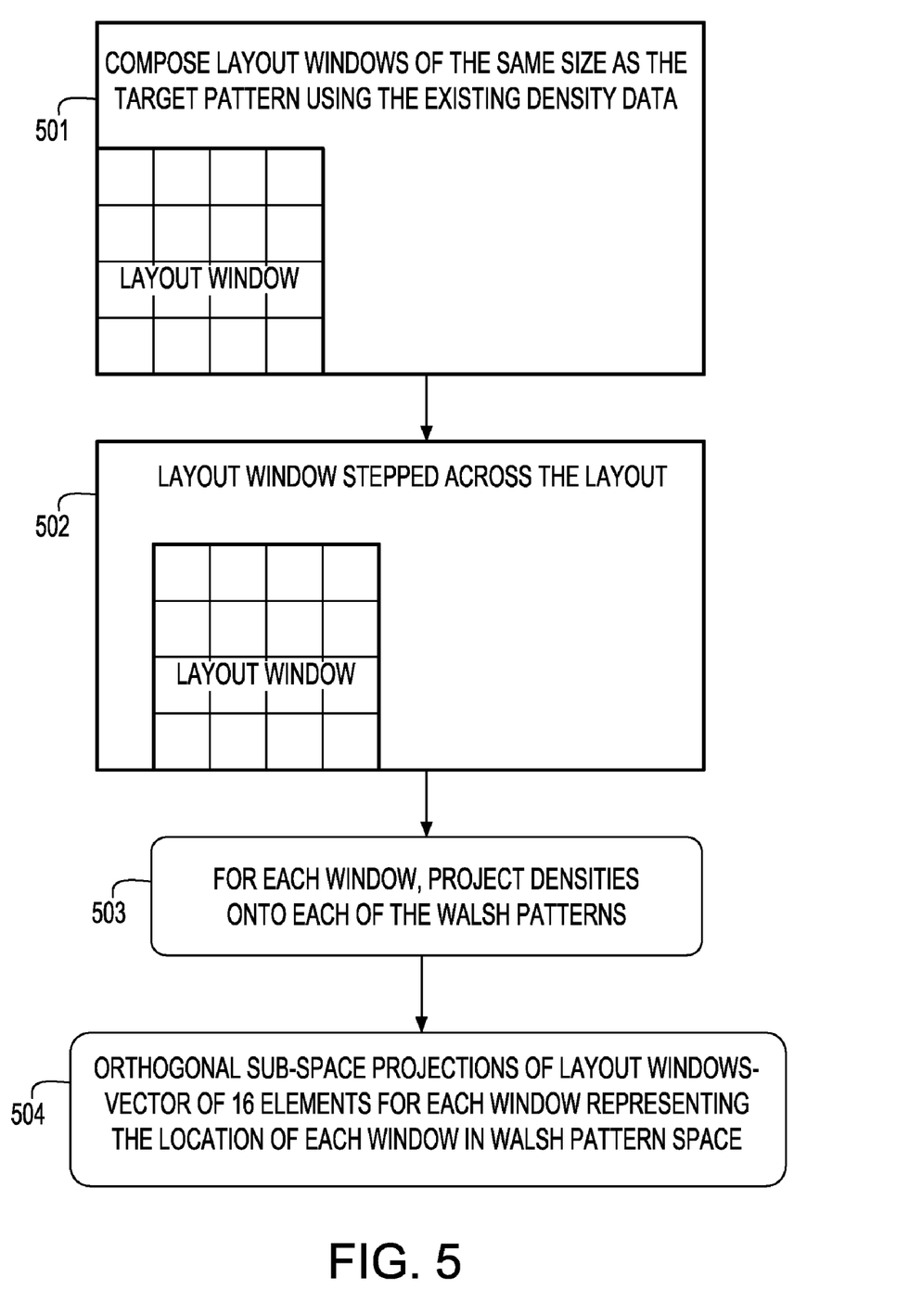
FIG. 5 is a flowchart illustrating projection of the layout windows onto the Walsh pattern space.

Referring to FIG. 5, layout windows the same size as the target pattern are created (Step 501). These layout windows are composed using the existing density data which was extracted by the method in FIG. 3. The layout window is stepped across the layout (Step 502). Overlapping the windows results in high resolution search. For each window, the densities are projected onto each of the Walsh patterns (Step 503). The result for each layout window is a vector of 16 elements representing the location of that layout window in the Walsh pattern space (Step 504).

Figure 6:
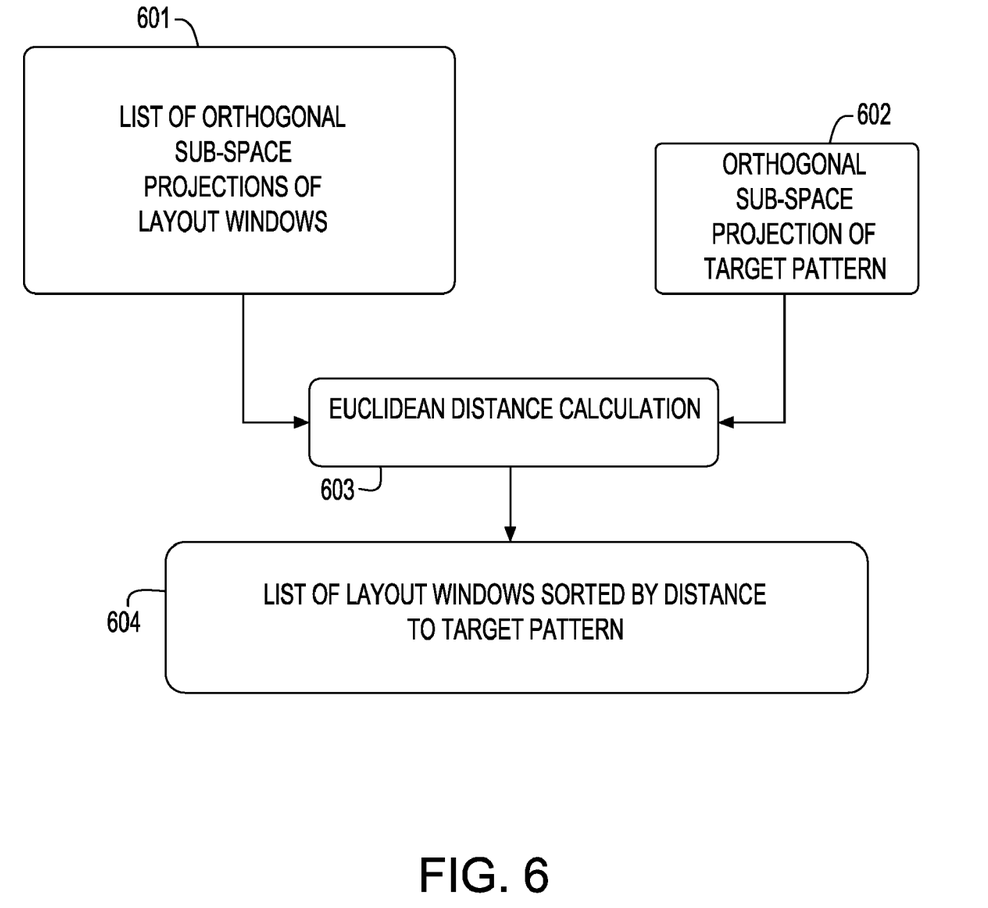
FIG. 6 is a flowchart illustrating a comparison of each layout window to the target pattern to perform pattern matching.

Referring to FIG. 6, each of the layout windows (Step 601, result of FIG. 5) is compared to the target pattern (Step 602, result of FIG. 4). The search is then performed by calculating the Euclidean distance from the target to each of the layout windows (Step 603), as in the prior art. The comparison of each layout window to the target pattern results in a list of layout windows which match the target pattern. The list is sorted by Euclidean distance to the target pattern in the Walsh pattern feature space (Step 604).

The present invention enables the reuse of density data to form windows of the same size as other target patterns. The density data can be extracted from the integrated shapes layout once at a high resolution, and then can be composed into windows the size of other target patterns.

The orthogonal sub-space projection method is used for both the target pattern and the layout windows. More particularly, the orthogonal sub-space projection method consists of the following steps:

1) Selecting a set of W Walsh patterns to be used as the basis vectors for the projection (FIG. 1). These Walsh patterns define the axes of the sub-space coordinate system to be used in the resultant feature vector.

2) Representing each Walsh pattern as a vector wherein each vector component has the value 1 or −1 (FIG. 2), for each Walsh pattern WPj, in this case j in [1 ... W], define $\overrightarrow{WPj}$ as the jth vector containing W values.

In the case where W<R, these is no need to represent the Walsh patterns in the full R-dimensional space. The dimensionality R of the full-space is used only in the actual projection step.

3) Defining a rectangular layout window containing layout shapes (FIG. 3).

4) Dividing the layout window into R equal-sized rectangles (FIG. 3).

In this case the resolution of the layout window (division into R=16 rectangles) is the same as that of the Walsh patterns. However, the invention also applies to subdivisions of the layout window that are of a finer resolution than that needed to represent the Walsh patterns, i.e., the invention holds for R≧W. Choosing R>W enables a window to be stepped in small increments across the layout, reusing the precalculated density data.

5) For each rectangle i in [1 ... R]
calculating the density (fractional area of the window covered by shapes) and mapping it to the range [−1, 1] (FIG. 3).

Defining $\overrightarrow{A}$ as the vector containing the R mapped densities calculated in step 5, one vector component for each rectangle.

Projecting the layout window onto each of the W Walsh patterns as follows: for j in [1 ... W]

$Pj = \overrightarrow{WPj} * \overrightarrow{A}$ where $\overrightarrow{WPj} * \overrightarrow{A} = \Sigma$ from $i=1$ to $W$ of $WPji * Ai$ Practitioners of the art will readily recognize that each projection forms one dimension of the 16-element feature vector representing the location of that layout window in the Walsh pattern feature space.

For W=16, describing the location of the layout window in the W-dimensional Walsh pattern coordinate system as the following feature vector:

P1, P2, P3, P4, P5, P6, P7, P8, P9, P10, P11, P12, P13, P14, P15, P16

In summary, the orthogonal sub-space projection method represents a highly significant improvement over the previously-used non-orthogonal Walsh pattern intersection method. In addition, this invention provides for density extraction as a separate step from the projection, allowing overlapping windows for high resolution search and allowing density data to be reused for other target window sizes.

While the present invention has been particularly described in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present embodiment of the invention.

What is claimed and desired to be protected by Letters Patents is:

1. A method of providing an orthogonal projection of circuit design layout shapes onto a basis of Walsh patterns, each of the Walsh patterns consisting of a plurality of sub-windows, the method comprising the steps of:

a. representing the Walsh patterns as a set of first vectors numbering W, {WP.sub.1, WP.sub.2, ... WP.sub.W}, forming a basis, each of said Walsh patterns having respective components, numbering R, WP.sub.i=(WP.sub.i.sup.1, WP.sub.i.sup.2, ..., WP.sub.i.sup.R), said components WP.sub.i.sup.j (i ranging from 1 to W; and j ranging from 1 to R) being either +x or −x, wherein 'x' is a real number, each of said components WP.sub.i.sup.j corresponding to a sub-window of said Walsh pattern;

b. defining a layout window containing said circuit design layout shapes and subdividing said circuit design layout window into R sub-windows having the same resolution as said Walsh patterns;

c. calculating a density of each circuit design layout sub-window, mapping the density to the range −x to +x, and forming from said mapped densities a second vector A, having a dimension R, wherein A=(A.sub.1, A.sub.2, ..., A.sub.R);

d. projecting the second vector A of said mapped layout densities onto each of said W Walsh patterns WP.sub.i; and e. forming a third vector P of dimension W from said projections, said third vector P being an orthogonal projection of said layout window onto said Walsh pattern basis;

wherein said layout window is a target pattern consisting of layout shapes resulting in a projection vector T, and wherein said layout window is one of a plurality of said windows of circuit design shapes layout, resulting in a plurality of projection vectors L.sub.k, wherein k ranges from 1 to N, and N is the number of windows of said circuit design layout shapes; and wherein said layout window is a target pattern consisting of layout shapes resulting in a projection vector T, and wherein said layout window is one of a plurality of said windows of circuit design shapes layout, resulting in a plurality of projection vectors L.sub.k, wherein k ranges from 1 to N, and N is the number of windows of said circuit design layout shapes.

2. The method of claim 1, wherein said real number 'x' equals 1.

3. The method of claim 1, wherein said sub-window is a rectangle.

4. The method of claim 1, wherein the density is a feature which is extracted from said integrated circuit shapes layout.

5. The method of claim 1 further comprising calculating a Euclidean distance between said vector T representing the target pattern and each of the vectors L.sub.k representing the windows of said circuit design shapes layout.

6. The method of claim 1, wherein said Euclidean distances are used for sorting said N layout windows whose projection vectors are L.sub.k into a list of window projections, ordered such that the windows closest to said target pattern are at the beginning of said list.

7. The method of claim 1, wherein R is greater than or equal to W, allowing the subdivision of the layout to be finer than that of said Walsh patterns.

8. The method of claim 1, wherein windows represented by said projection vectors L.sub.k are overlapping, resulting in a high resolution search.

9. The method of claim 1, wherein the basis consisting of Walsh patterns is a subset of a full set of said Walsh patterns.

* * * * *